United States Patent
Raimar et al.

(10) Patent No.: US 12,040,747 B2
(45) Date of Patent: Jul. 16, 2024

(54) PRECISION INTERNAL LOW-FREQUENCY OSCILLATOR TO GENERATE REAL-TIME CLOCK

(71) Applicant: Cypress Semiconductor Corporation, San Jose, CA (US)

(72) Inventors: Nandakishore Raimar, Bangalore (IN); H P Sachin, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 386 days.

(21) Appl. No.: 17/565,212

(22) Filed: Dec. 29, 2021

(65) Prior Publication Data

US 2022/0337190 A1  Oct. 20, 2022

Related U.S. Application Data

(60) Provisional application No. 63/176,751, filed on Apr. 19, 2021.

(51) Int. Cl.

| | |
|---|---|
| H03K 3/0231 | (2006.01) |
| H03B 5/24 | (2006.01) |
| H03K 3/011 | (2006.01) |
| H03K 3/023 | (2006.01) |
| H03K 3/037 | (2006.01) |
| H03K 5/24 | (2006.01) |
| H04W 56/00 | (2009.01) |

(52) U.S. Cl.
CPC ............ *H03B 5/24* (2013.01); *H03K 3/011* (2013.01); *H03K 3/023* (2013.01); *H03K 3/0231* (2013.01); *H03K 3/037* (2013.01); *H03K 5/24* (2013.01); *H04W 56/001* (2013.01)

(58) Field of Classification Search
CPC .......... H03B 5/24; H03K 3/011; H03K 3/023; H03K 3/0231; H03K 5/24; H04W 56/001
USPC .................................................. 331/111, 143
See application file for complete search history.

(56) References Cited

U.S. PATENT DOCUMENTS

| | | | | |
|---|---|---|---|---|
| 5,508,664 A | * | 4/1996 | Rizzo | H03K 3/017 331/111 |
| 5,565,819 A | * | 10/1996 | Cooper | H03K 3/0231 331/111 |
| 5,670,915 A | * | 9/1997 | Cooper | H03K 3/0231 331/111 |

(Continued)

*Primary Examiner* — Levi Gannon

(57) ABSTRACT

An oscillation circuit includes resistors with tap points for high/low reference voltages. An RC network coupled in parallel with the resistors includes a first capacitor to vary a first voltage input and a second capacitor to generate a second voltage input. A first comparator alternately compares the voltage inputs with the low reference voltage to generate oscillation outputs. A PTAT current DAC supplies an injection current to a resistor of the series of resistors that variably modulates the reference voltages. A second comparator alternately compares the voltage inputs with the high reference voltage and controls generation of an adaptive bias current to first comparator near a switching threshold voltage range thereof. A chop switch matrix alternately flips voltage reference inputs to input terminals of first comparator. A multiplexer alternately inverts a polarity of the oscillation outputs in concert with alternately flipping the voltage reference inputs by the chop switch matrix.

20 Claims, 6 Drawing Sheets

(56) References Cited

U.S. PATENT DOCUMENTS

| | | | | |
|---|---|---|---|---|
| 6,020,792 A * | 2/2000 | Nolan | ............ | H03K 3/0231 |
| | | | | 331/111 |
| 6,727,768 B1 * | 4/2004 | Dasgupta | ............ | H03K 3/0231 |
| | | | | 331/177 R |
| 7,940,135 B2 * | 5/2011 | Nezuka | ............ | H03K 4/06 |
| | | | | 327/131 |
| 8,373,502 B1 * | 2/2013 | Chen | ............ | H03H 11/1291 |
| | | | | 327/554 |
| 10,135,428 B2 * | 11/2018 | Hunter | ............ | H03B 5/24 |
| 10,581,441 B2 * | 3/2020 | Pu | ............ | H02M 3/33546 |
| 2006/0181360 A1 * | 8/2006 | Mirow | ............ | H03K 3/0231 |
| | | | | 331/144 |
| 2009/0072918 A1 * | 3/2009 | Chung | ............ | H03K 4/501 |
| | | | | 331/113 R |
| 2014/0375392 A1 * | 12/2014 | Sinitsky | ............ | H03K 3/0231 |
| | | | | 331/111 |
| 2015/0194949 A1 * | 7/2015 | McQuirk | ............ | H03K 5/00006 |
| | | | | 327/291 |

* cited by examiner

PRECISION INTERNAL LOW-FREQUENCY OSCILLATOR TO GENERATE REAL-TIME CLOCK

RELATED APPLICATIONS

This application claims the benefit of U.S. Provisional Patent Application No. 63/176,751, filed on Apr. 19, 2021, the entire contents of which is incorporated herein by this reference.

TECHNICAL FIELD

The disclosure pertains to precise synchronized wakeup of wireless devices, and more particularly, to a precision internal low-frequency oscillator to generate a real-time clock (RTC).

BACKGROUND

Wireless interfaces associated with wireless technology such as Bluetooth®, Wi-Fi™, Zigbee™, or the like, use an RTC to synchronize or control a wake up time, for example, between multiple wireless devices. For precise synchronization, a precise count or tracking of time by the RTC is employed. Current solutions employ a crystal-based RTC for sufficient precision. Use of a crystal, however, requires addition board space and bill of materials, to include the crystal and load capacitors, which are bulky and expensive. Use of a crystal oscillator also requires an additional pin for a wireless chip and introduces additional design constraints that have to be overcome to make the oscillator work efficiently.

DETAILED DESCRIPTION

Figure 1:
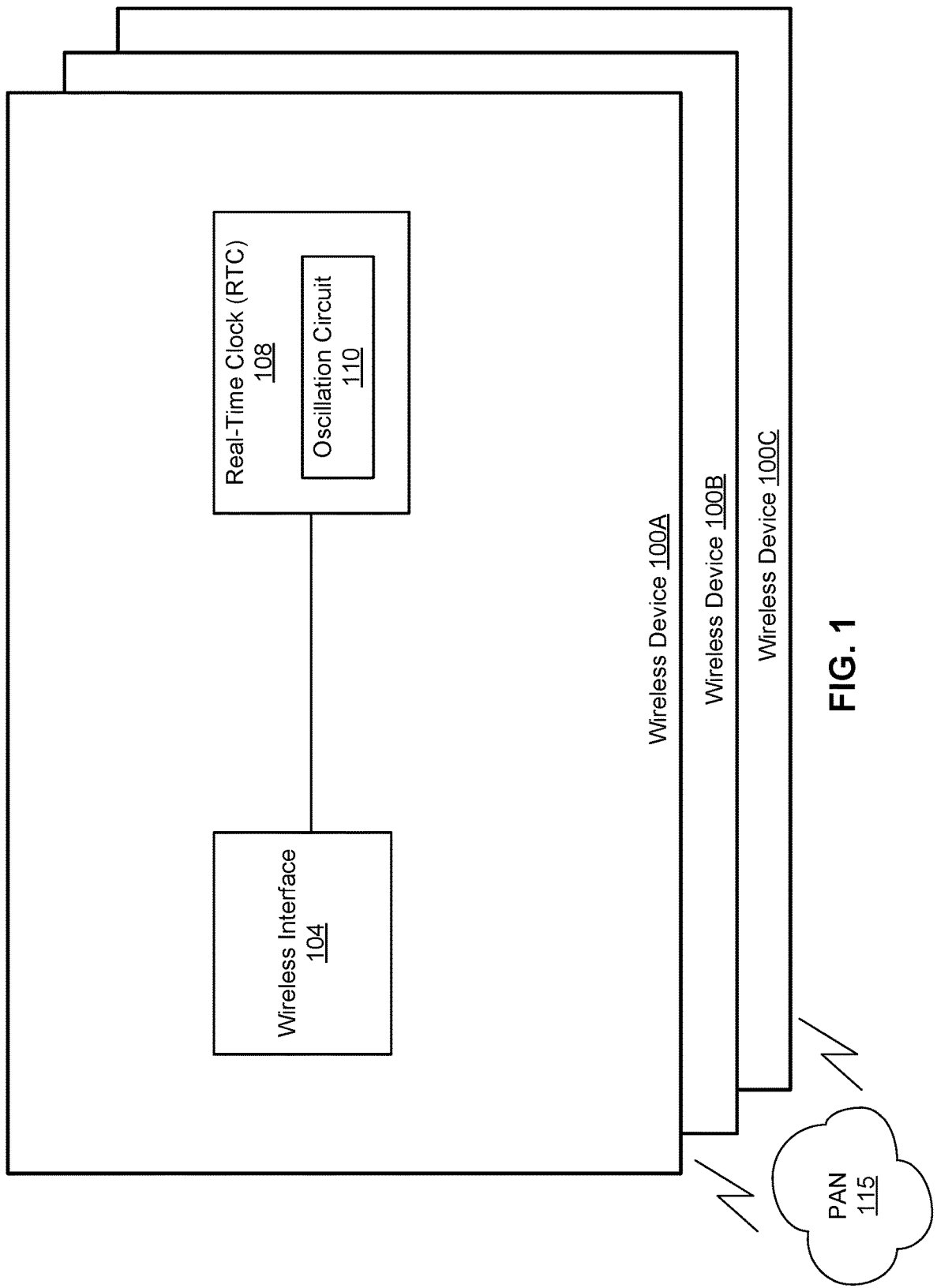
FIG. 1 is a network diagram of multiple wireless devices that employ a real-time clock (RTC) according to at least one embodiment.

The disclosed embodiments are directed to a precision low-frequency oscillator to generate a real-time clock (RTC) in, for example, wireless devices that synchronize a wakeup. As mentioned, to meet precision requirements for tracking time, a crystal-based oscillator may be employed in an RTC. Present specifications for an oscillator of the RTC include frequency drift with respect of temperature that is less than 70 part-per-million (PPM) per degree Celsius (C) and noise with overall noise drift budget of less than 250 ppm for a selected temperature span. The oscillator should also operate normally despite low frequency drift due to flicker and higher order noise. Thus, the specifications may be expanded to meet a low Allan Deviation, e.g., less than 50 ppm at a 20 milliseconds (ms), which may be part of the 250 ppm budget. Allan Deviation is a unitless measure of stability, typically used to quantify the stability of clocks and other oscillators.

Aspects of the present disclosure address the above and other deficiencies by integrating, within an RTC, a non-crystal-based oscillator via an integrated circuit (IC)-based approach, e.g., with an oscillation circuit that may be integrated within, or operate as, an RTC. In at least some embodiments, the oscillation circuit is configured to modulate a reference voltage to achieve a low frequency drift temperature coefficient in a first (or fast) comparator that generates oscillation outputs. In these embodiments, the oscillation circuit may further include a second (or slow) comparator that is adapted to control generation of an adaptive bias current that is supplied, e.g., as a boost current, to the first comparator near a switching threshold voltage range of the first comparator. The timing of the adaptive bias current may be controlled to achieve low resolution delay compared to oscillation period with low average operating current of the first comparator.

In these embodiments, the oscillation circuit may further include a chop switch matrix to alternately flip voltage reference inputs to a set of input terminals of the first comparator and a multiplexer coupled to an output of the first comparator. The multiplexer may be configured to alternately invert a polarity of the oscillation outputs at an output of the first comparator in concert with alternately flipping the voltage reference inputs by the chop switch matrix. The multiplexer may feed a latch or flip-flop whose output is the clock that feeds back for timing of oscillation of the oscillation circuit. This self-clock chopper stabilization may be performed to minimize long jitter generated due to device noise of the first comparator and minimize frequency drift due to the offset of the first comparator.

Advantages of the present disclosure include, but are not limited to meet strict specifications of low frequency drift with respect to temperature change and meeting a low Allan Deviation while minimizing power consumption, as will be discussed. These and other advantages that would be apparent to those skilled in the art will be apparent from the following more detailed discussion.

FIG. 1 is a network diagram of multiple wireless devices 100A, 100B, 100C that each employ a real-time clock (RTC) according to at least one embodiment. The multiple wireless devices may communicate over a personal area network (PAN) 115 established with certain wireless standards such as Bluetooth®, Wi-Fi™, Zigbee™, or the like.

By way of example, in at least some embodiments, a first wireless device 100A of the multiple wireless devices includes a wireless interface 104 to exchange data over the PAN 115. The first wireless device 100A may further include an RTC circuit 108 coupled to the wireless interface 104, e.g., that may provide a precise clock in order to synchronize wake up across the multiple wireless devices 100A, 100B, 100C, which are similarly configured. In some embodiments, the clock generation is triggered off a master clock (e.g., reset_bar). For example, the RTC circuit 108 may include an oscillation circuit 110 that may be instantiated on a printed circuit board or as an integrated circuit to include oscillation circuitry as discussed hereinafter.

Figure 2:
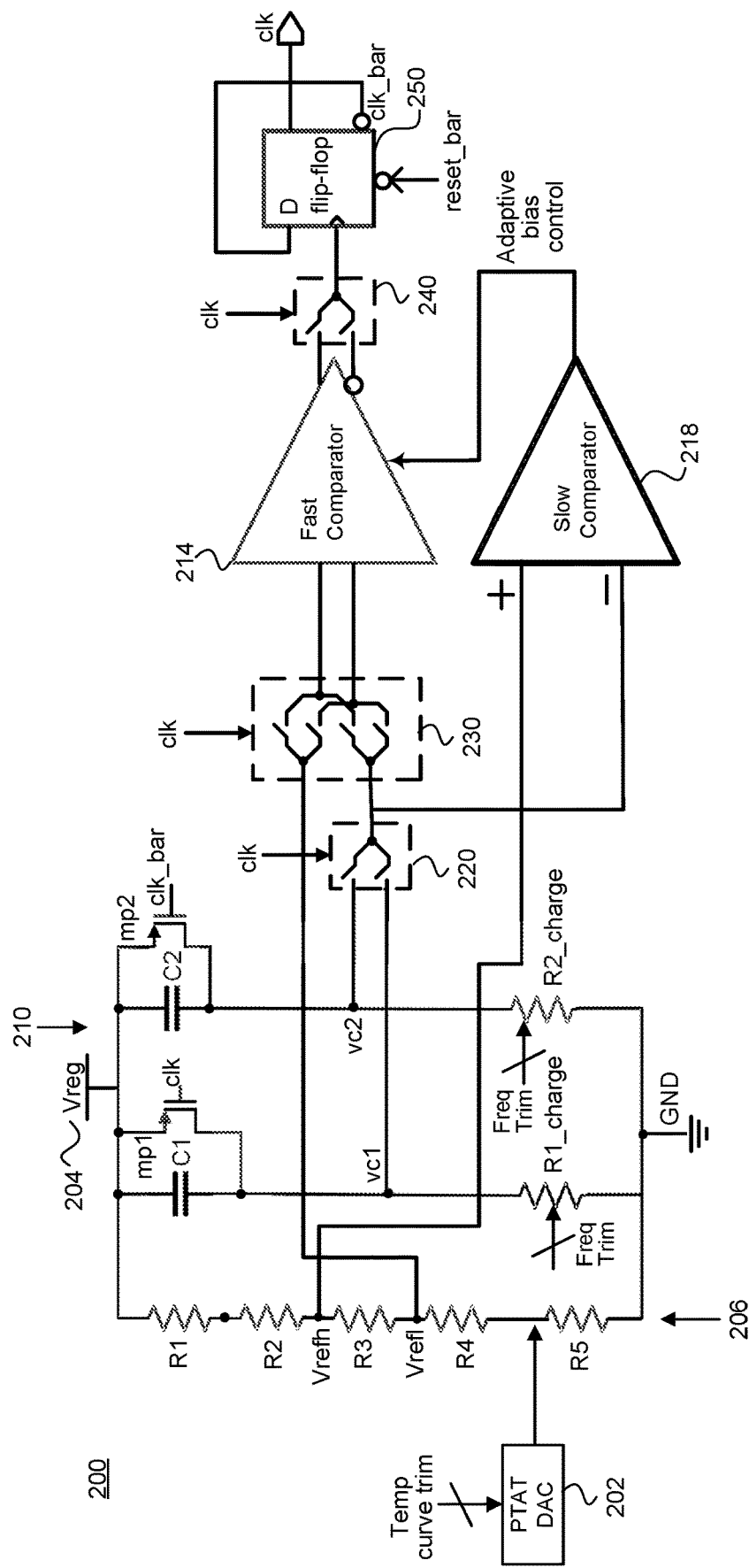
FIG. 2 is a circuit diagram of a non-crystal-based oscillator that may be employed in an RTC according to at least one embodiment.

FIG. 2 is a circuit diagram of a non-crystal-based oscillator 200 that may be employed in an RTC according to at least one embodiment. In one embodiment, the non-crystal-based oscillator 200 is the oscillation circuit 100 of FIG. 1. In at least some embodiments, the oscillator 200 includes a series of resistors 206 including tap points that provide a high reference voltage (Vrefh) and a low reference voltage (Vrefl) that is lower than the high reference voltage. The series of resistors 206 may be coupled between a regulator voltage (Vreg) 204 and ground (GND). The regulator voltage 204 may be a supply voltage that does not drift with temperature change, e.g., is regulated to avoid variation due to temperature. In these embodiments, a resistor capacitor (RC) network 210 is coupled in parallel with the series of resistors 206.

In various embodiments, the RC network 210 may include a first capacitor (C1) to vary a first voltage input (vc1) and a second capacitor (C2) to generate a second voltage input (vc2). The RC network 210 may further include a first charge resistor (R1_charge) coupled between the first capacitor and ground, where a first node between the first capacitor and the first charge resistor provides the first voltage input (vc1). The RC network 210 may further include a second charge resistor (R2_charge) coupled between the second capacitor and ground, where a second node between the second capacitor and the second charge resistor provides the second voltage input (vc2). In other embodiments, the capacitors and charge resistors may be swapped, as will be discussed with reference to FIG. 5. In these embodiments, a frequency trim can be applied by variably changing the resistances of the first and second charge resistors.

In at least some embodiments, the oscillator 200 further includes a first comparator 214 to alternately compare the first voltage input (vc1) and the second voltage input (vc2) with the low reference voltage (Vrefl) to generate oscillation outputs. The first comparator 214 is also referred to as a fast comparator herein, in being adapted to precisely trigger at high frequencies.

In disclosed embodiments, a first order change in frequency may be caused due to temperature change of the oscillator 200. More specifically, the overall frequency of the oscillator 200 is largely defined by the RC time constant of the RC network 210, which is linear in nature. For example, the temperature change affects an amount of voltage dropped across the first charge resistor (R1_charge) and the second charge resistor (R2_charge), which impact the voltage inputs vc1 and vc2. The temperature change also impacts the values of the high reference voltage (Vrefh) and the low reference voltage (Vrefl). Therefore, to compensate for the frequency drift, current through the low reference voltage (Vrefl) may be modulated, e.g., using a tap point between the low reference voltage (Vrefl) and ground (GND), for example, to achieve stable clock frequency over temperature.

In at least some embodiments, therefore, the oscillator 200 further includes a proportional-to-absolute temperature (PTAT) current digital-to-analog converter (DAC), or PTAT current DAC 202, configured to supply an injection current to a resistor of the series of resistors 206 that variably modulates the low reference voltage (Vrefl) and the high reference voltage (Vrefh). In some embodiments, the resistor (e.g., R5) is coupled between other resistors (e.g., R1-R4) of the series of resistors 206 and the ground (GND). Further, in these embodiments, there is at least a second resistor (e.g., R3 in this example) positioned between tap points of the series of resistors 206 for the high reference voltage (Vrefh) and the low reference voltage (Vrefl).

In these embodiments, the injection current generated by the PTAT current DAC 202 is based on a temperature coefficient of the resistor (R5) and is modulated by a temperature curve trim to compensate a frequency of the oscillation outputs of the first comparator 214 according to temperature change of the oscillator 200. More specifically, if a frequency of oscillation of the first comparator 214 drifts, the PTAT current DAC 202 compensate to stabilize frequency with respect to temperature. For example, if a higher slope compensation is needed, the PTAT current DAC 202 may inject more current. In contrast, if a lower slope compensation is needed, the PTAT current DAC 202 may inject less current. In at least some embodiments, the PTAT current DAC 202 functionality may be extended to a second order curvature correction using variable slope PTAT curvature correction, for example.

With additional specificity, the architecture of the oscillator 200 uses the RC time constant to generate a delay between two successive edges of a clock, which is being output by the oscillator 200. During the oscillation, for example, the first capacitor (C1) and the second capacitor (C2) charge to a voltage, e.g., Vreg–Vc1 or Vreg–Vc2, respectively, in a mutually exclusive fashion (see FIG. 3). Once a bottom plate of a capacitor falls below the low voltage reference (Vrefl), the first comparator 214 trips resulting in the discharge of the capacitor. The oscillator 200 may further include a flip-flop 250 (or a latch) that narrows the pulse at the output of the first comparator 214 into a clock signal (clk), e.g., the clock. The flip-flop-generated clock may be fed back into the oscillator 200 to provide timing of oscillatory switching, as will be explained.

With additional reference to FIG. 2, in at least some embodiments, the oscillator 200 further includes a second comparator 218 to alternately compare the first voltage input (vc1) and the second voltage input (vc2) with the high reference voltage (Vrefh) and to control the generation of an adaptive bias current (e.g., by a current source) that is supplied to the first comparator 214 near a switching threshold voltage range of the first comparator 214. The second comparator 218 is also referred to as a slow comparator in monitoring the voltage at a bottom plate of the first and second capacitors over a longer period of time than the output of the first comparator 214, and enables the generation of the adaptive bias current to the second comparator 218 when that voltage falls below the high reference voltage, Vrefh. In some embodiments, a voltage difference between the high reference voltage and the low reference voltage is within 20% of 100 millivolts (mV), or similar range.

In this way, the first comparator 214 may normally operate with a low bias current, and the second comparator 218 may provide or control the generation of additional bias current boost near the switching threshold of the low reference voltage so that resolution delay becomes insignificant compared to the oscillating period. Further, the second comparator 218 may operate with low power consumption, yet have enough operating current near the switching threshold voltage range of the first comparator 214, allowing a reduction in the overall power consumption of the oscillator 200. In one embodiment, the reduction in overall power consumption is one fourth of the power compared to when not using adaptive biasing of the first comparator 214, enabling being able to meet hibernation-related specifications.

Figure 3:
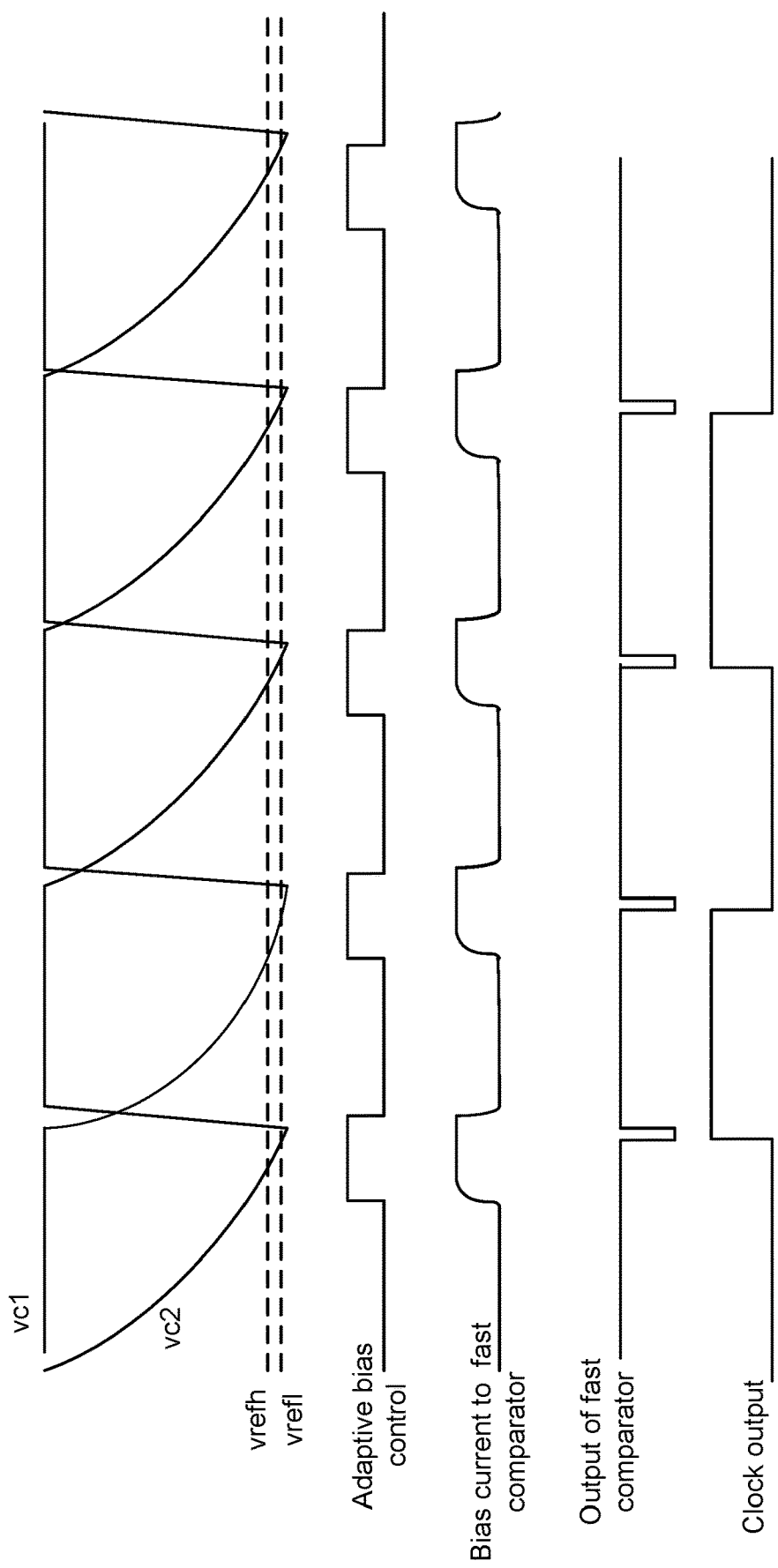
FIG. 3 is a set of graphs illustrating timing of various reference voltages, nodes, and outputs of the circuit diagram of FIG. 2 that illustrate low resolution delay compared to oscillation period and with low average operating current according to some embodiments.

FIG. 3 is a set of graphs illustrating timing of various reference voltages, nodes, and outputs of the circuit diagram of FIG. 2 that illustrate low resolution delay compared to oscillation period and with low average operating current according to some embodiments. As may be observed in the first voltage input (vc1) curve and the second voltage input (vc2) curves, the first comparator 214 alternates discharging of the first capacitor (C1) and the second capacitor (C2) according to clock cycle. The other waveforms that are illustrated include the adaptive bias control from the second comparator 218, a corresponding bias current waveform supplied to the first comparator 214, the pulsed output of the first comparator 214, and the clock output (clk) from the flip-flop 250 of the oscillator 200 (FIG. 2).

As the high reference voltage (Vrefh) triggers the second comparator 218 slightly before the first comparator 214 is triggered by the low reference voltage (Vrefl), e.g., within 20% of 100 mV, the adaptive bias control and bias current curves (indicating the bias current being injected into the first comparator 214) are triggered at switching thresholds of the first comparator 214. Thus, the clock output may be transitioned at these switching thresholds with a short output pulse from the first comparator 214. In this way first comparator 214 operates in high power or high bandwidth mode, for a short time enabling more precise and fast resolution with an overall low power consumption.

With additional reference to FIG. 2, according to some embodiments, the oscillator 200 further includes a chop switch matrix 230 coupled between the low reference voltage (Vrefl) node, the RC network 210, and the first comparator 214, as illustrated. The chop switch matrix 230 may be configured to alternately flip voltage reference inputs to a set of input terminals of the first comparator 214. In these embodiments, the oscillator 200 further includes a multiplexer 240 coupled to an output of the first comparator 214. The multiplexer 240 may alternately invert a polarity of the oscillation outputs of the first comparator 214 in concert with alternately flipping the voltage reference inputs to the first comparator 214 by the chop switch matrix 230.

Figure 4:
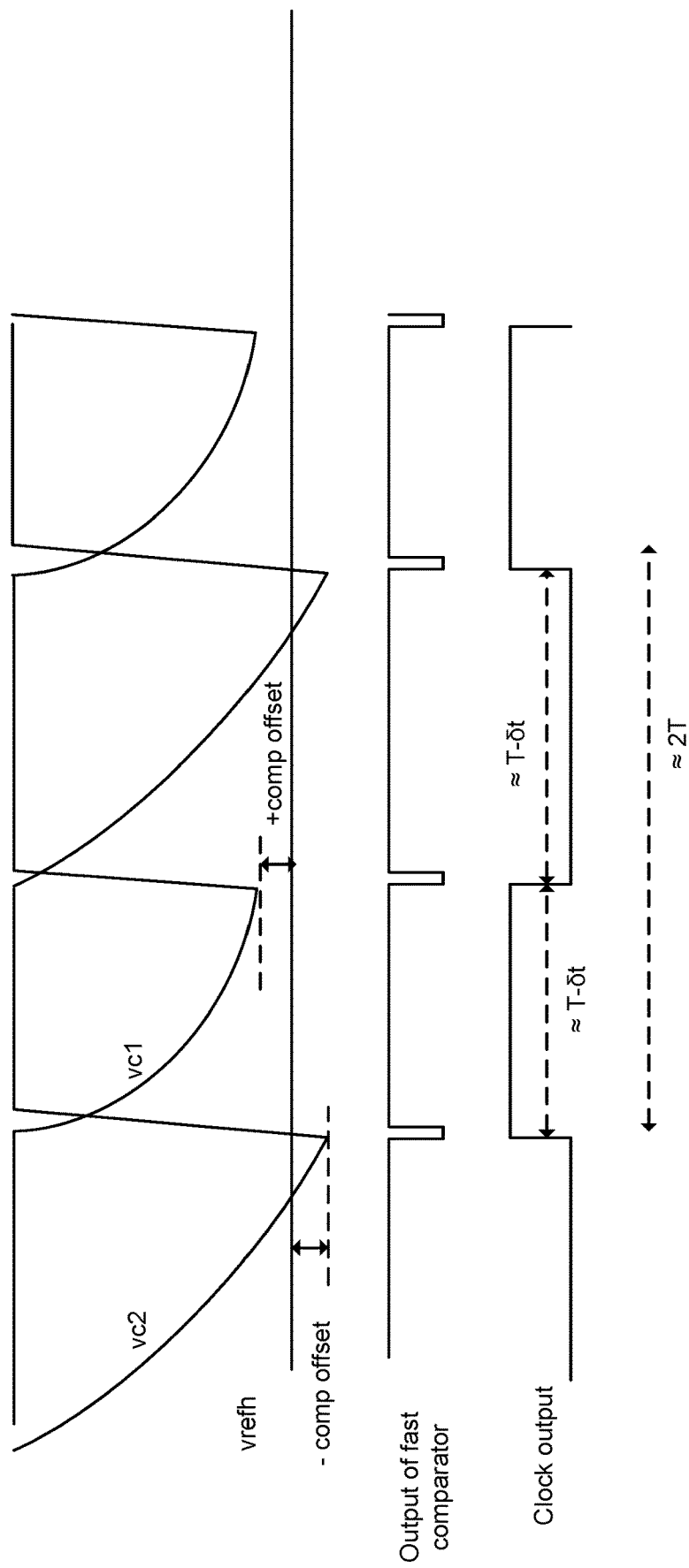
FIG. 4 is a set of graphs illustrating timing of the second comparator based on use of the chop switch matric and output multiplexer according to some embodiments.

In at least some embodiments, as discussed, the oscillator 200 further includes the flip-flop 250 coupled to the output of the multiplexer 240. The flip-flop 250 may generate the clock (clk) that in turn drives timing of alternately flipping the voltage reference inputs to the set of input terminals of the first comparator 214 by the chop switch matrix 230. In some embodiments, the voltage reference inputs are the low reference voltage (Vrefl) and the first voltage input (vc1) during a first clock cycle and the second voltage input (vc2) and the low reference voltage (Vrefl) during a second clock cycle of the clock that immediately follows the first clock cycle, as illustrated in FIG. 4. In other words, the voltage references of the first comparator 214 are flipped every edge of a clock pulse. Thus, as illustrated in FIG. 4, the low-frequency noise voltage offset gets added one clock cycle (+comp offset) and the low-frequency noise voltage offset gets subtracted another clock cycle (−comp offset), allowing an elimination of low-frequency and any DC noise only impacts duty cycle distortion rather than frequency drift.

In this way, by switching the polarity of the first comparator 214 each clock cycle, flicker and higher-order noise of the first comparator 214 as well as a direct-current (DC) voltage offset of the first comparator 214 is averaged out. This elimination via averaging of flicker noise, higher-order noise, and DC offset values can result in a clock (clk) with a very low Allan Deviation value (e.g., less than 50 ppm) and very low frequency drift (e.g., 32 KHz clock with no more than 70 ppm/C) due to changes in temperature coefficients of the IC components. Further, this low-frequency noise may be modulated in duty-cycle distortion of the clock (see clock output in FIG. 4).

With additional reference to FIG. 2, in at least some embodiments, the oscillator 200 includes a first transistor (mp1) that is drain-source connected across the first capacitor (CP1) and controlled according to the clock (clk), and a second transistor (mp2) that is drain-source connected across the second capacitor and controlled according to an inverted signal of the clock (clk bar), thus alternating charging between the first and second capacitors. As illustrated, these transistors mp1 and mp2 may be p-type transistors. In some embodiments, the oscillator 200 further includes a sample multiplexer 220 coupled between the RC network 210 and the chop switch matrix 230. The sample multiplexer 220 may be controlled by the clock and configured to alternately select the first voltage input (vc1) and the second voltage input (vc2) according to the clock (clk).

Figure 5:
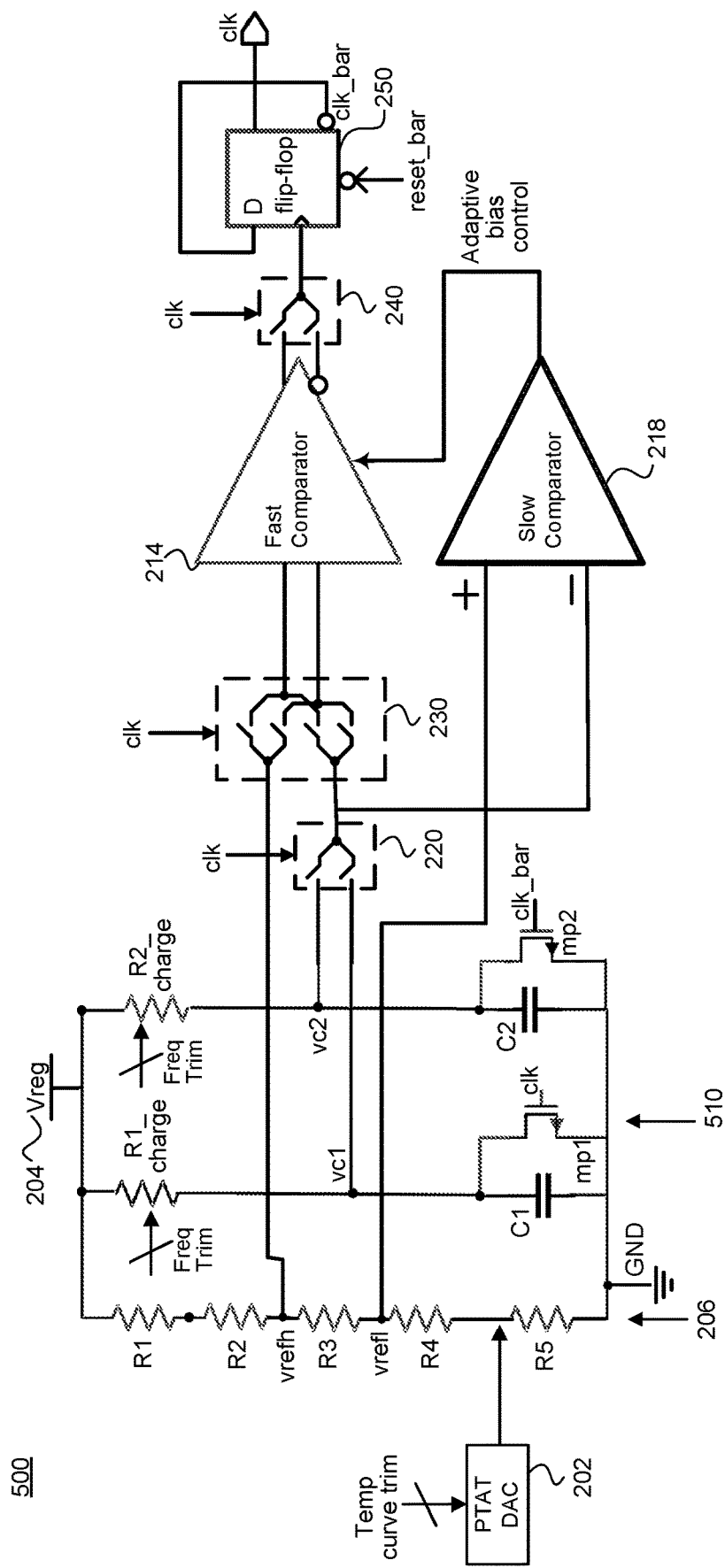
FIG. 5 is a circuit diagram of a non-crystal-based oscillator that may be employed in an RTC according to at least another embodiment.

FIG. 5 is a circuit diagram of a non-crystal-based oscillator 500 that may be employed in an RTC according to at least another embodiment. In this embodiment, the oscillator 500 is similar to the oscillator 200 of FIG. 2, but with some changes to the RC network 210. In the embodiment of FIG. 5, the oscillator 500 instead includes an RC network 510 having a first capacitor (C1) between a first node and ground to vary the first voltage input (vc1) and a second capacitor (C2) between a second node and ground to generate the second voltage input (vc2). In this embodiment, the RC network 510 further includes a first charge resistor (R1_charge) coupled between the first capacitor and the regulator voltage 204, where the first node is positioned between the first capacitor and the first charge resistor and provides the first voltage input (vc1). The RC network 510 further includes a second charge resistor (R2_charge) coupled between the second capacitor and the regulator voltage 204, where the second node is positioned between the second capacitor and the second charge resistor and provides the second voltage input (vc2). In these embodiments, a frequency trim can be applied by variably changing the resistances of the first and second charge resistors.

As before, the RC network 510 may further include a first transistor (mp1) that is drain-source connected across the first capacitor (CP1) and controlled according to the clock (clk), and a second transistor (mp2) that is drain-source connected across the second capacitor and controlled according to an inverted signal of the clock (clk bar), thus alternating charging between the first and second capacitors C1 and C2. As illustrated, these transistors mp1 and mp2 may be n-type transistors.

In these embodiments, the PTAT current DAC 202 may still provide the current injection at the illustrated tap point of the series of resistors 206, e.g., to adjust the low reference voltage (Vrefl) and the high reference voltage (Vrefh). In some embodiments, however, the PTAT current DAC 202 may also insert an additional current injection at another tap point along the series of resistors 206 to provide second order curvature correction.

Further, in these embodiments of the oscillator 500, the high voltage reference (Vrefh) is instead provided to the first comparator 214 as the reference voltage to be alternately compared to the first voltage input (vc1) and the second voltage input (vc2) to generate the oscillation outputs. Similarly, the second comparator 218 instead alternately compares the first voltage input and the second voltage input with the low reference voltage (Vrefl) and controls generation of an adaptive bias current that is supplied to the first comparator 214 at switching thresholds of the first comparator 214. As before, a voltage difference between the high reference voltage (Vrefh) and the low reference voltage (Vrefl) may still be within 20% of 100 millivolts (mV) or the like.

With additional reference to FIG. 5, according to at least some embodiments of the oscillator 500, the flip-flop 250 generates a clock that drives timing of alternately flipping the voltage reference inputs to the set of input terminals by the chop switch matrix. Here, the voltage reference inputs may include the high reference voltage and the first voltage input during a first clock cycle and the second voltage input and the high reference voltage during a second clock cycle of the clock that immediately follows the first clock cycle. In other words, the voltage references of the first comparator 214 are flipped every clock edge. Other features and components of FIG. 5 are as was discussed with reference to FIG. 2.

Figure 6:
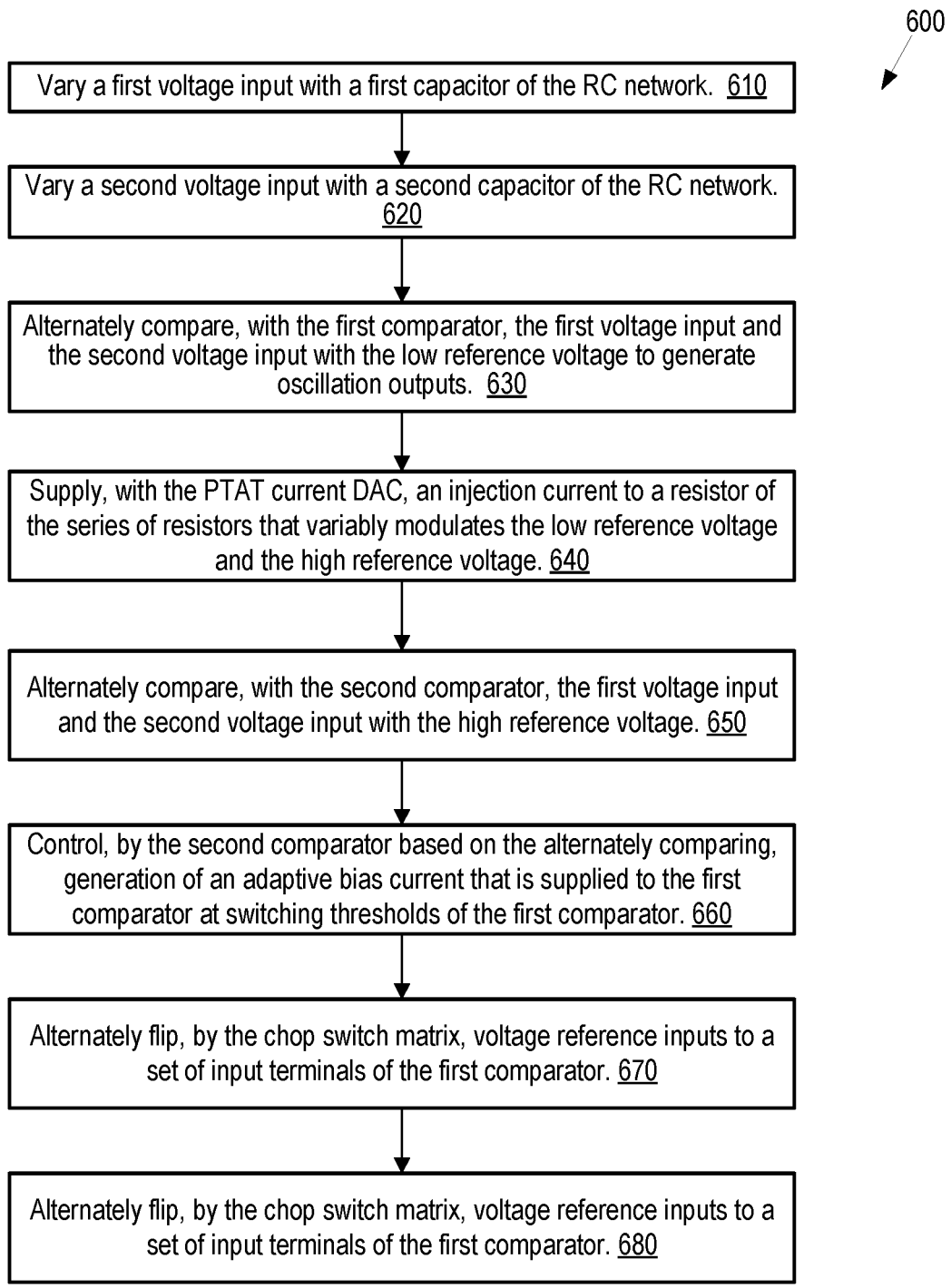
FIG. 6 is a flow diagram of an example method of operating the non-crystal-based oscillator according to at least one embodiment.

FIG. 6 is a flow diagram of an example method 600 of operating the non-crystal-based oscillator 200 according to at least one embodiment. In at least some embodiments, the oscillator 200 is as illustrated and explained with reference to FIG. 2, but may be the oscillation circuit 100 that is within the RTC circuit 108 of FIG. 1.

At operation 610, the oscillator 200 varies a first voltage input (vc1) with a first capacitor (C1) of the RC network 210.

At operation 620, the oscillator 200 varies a second voltage input (vc2) with a second capacitor (C2) of the RC network 210.

At operation 630, the oscillator 200 alternately compares, with the first comparator 214, the first voltage input and the second voltage input with the low reference voltage to generate oscillation outputs.

At operation 640, the oscillator 200 supplies, with the PTAT current DAC 202, an injection current to a resistor of the series of resistors 206 that variably modulates the low reference voltage (Vrefl) and the high reference voltage (Vrefh).

At operation 650, the oscillator 200 alternately compares, with the second comparator 218, the first voltage input (vc1) and the second voltage input (vc2) with the high reference voltage (Vrefh).

At operation 660, the oscillator 200 controls, by the second comparator 218 based on the alternately comparing of operation 650, generation of an adaptive bias current that is supplied to the first comparator at switching thresholds of the first comparator.

At operation 670, the oscillator 200 alternately flips, by the chop switch matrix 230, voltage reference inputs to a set of input terminals of the first comparator 214.

At operation 680, the oscillator 200 alternately inverts, by the multiplexer 240, a polarity of the oscillation outputs in concert with alternately flipping the voltage reference inputs by the chop switch matrix.

Reference throughout this specification to "one embodiment" or "an embodiment" means that a particular feature, structure, or characteristic described in connection with the embodiment (e.g., particular implementation) is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment, embodiment, and/or other exemplarily language does not necessarily refer to the same embodiment or the same example, but may refer to different and distinct embodiments, as well as potentially the same embodiment.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. Also, the terms "first," "second," "third," "fourth," etc. as used herein are meant as labels to distinguish among different elements and may not necessarily have an ordinal meaning according to their numerical designation.

What is claimed is:

1. An oscillation circuit comprising:
a series of resistors comprising tap points that provide a high reference voltage and a low reference voltage that is lower than the high reference voltage;
a resistor capacitor (RC) network coupled in parallel with the series of resistors, the RC network comprising a first capacitor to vary a first voltage input and a second capacitor to generate a second voltage input;
a first comparator to alternately compare the first voltage input and the second voltage input with the low reference voltage to generate oscillation outputs;
a proportional-to-absolute temperature (PTAT) current digital-to-analog converter (DAC) configured to supply an injection current to a resistor of the series of resistors that variably modulates the low reference voltage and the high reference voltage;
a second comparator to alternately compare the first voltage input and the second voltage input with the high reference voltage and to control generation of an adaptive bias current that is supplied to the first comparator near a switching threshold voltage range of the first comparator;
a chop switch matrix coupled between the low reference voltage, the RC network, and the first comparator, the chop switch matrix to alternately flip voltage reference inputs to a set of input terminals of the first comparator; and
a multiplexer coupled to an output of the first comparator, the multiplexer to alternately invert a polarity of the oscillation outputs in concert with alternately flipping the voltage reference inputs by the chop switch matrix.

2. The oscillation circuit of claim 1, wherein the series of resistors is coupled between a regulator voltage and ground, the resistor is coupled between other resistors of the series of resistors and the ground, and there is at least a second resistor positioned between tap points of the series of resistors for the high reference voltage and the low reference voltage.

3. The oscillation circuit of claim 1, wherein the injection current generated by the PTAT current DAC is based on a temperature coefficient of the resistor and is modulated by a temperature curve trim to compensate frequency of the oscillation outputs according to temperature change of the oscillation circuit.

4. The oscillation circuit of claim 1, wherein the RC network further comprises:
a first charge resistor coupled between the first capacitor and ground, wherein a first node between the first capacitor and the first charge resistor provides the first voltage input; and
a second charge resistor coupled between the second capacitor and ground, wherein a second node between the second capacitor and the second charge resistor provides the second voltage input.

5. The oscillation circuit of claim 1, further comprising a flip-flop coupled to the output of the multiplexer, the flip-flop to generate a clock that drives timing of alternately flipping the voltage reference inputs to the set of input terminals by the chop switch matrix.

6. The oscillation circuit of claim 5, wherein the voltage reference inputs comprise the low reference voltage and the first voltage input during a first clock cycle and the second voltage input and the low reference voltage during a second clock cycle of the clock that immediately follows the first clock cycle.

7. The oscillation circuit of claim 5, wherein the RC network further comprises:
a first transistor that is drain-source connected across the first capacitor and controlled according to the clock; and
a second transistor that is drain-source connected across the second capacitor and controlled according to an inverted signal of the clock.

8. The oscillation circuit of claim 5, further comprising a sample multiplexer coupled between the RC network and the chop switch matrix, the sample multiplexer controlled by the clock and to alternately select the first voltage input and the second voltage input according to the clock.

9. The oscillation circuit of claim 1, wherein a voltage difference between the high reference voltage and the low reference voltage is within 20% of 100 millivolts (mV).

10. A wireless device comprising:
a wireless interface to exchange data over a personal area network; and
a real-time clock (RTC) circuit coupled to the wireless interface, the real-time clock to synchronize a wakeup between multiple wireless devices, wherein the RTC circuit comprises:
a series of resistors comprising tap points that provide a high reference voltage and a low reference voltage that is lower than the high reference voltage;
a resistor capacitor (RC) network coupled in parallel with the series of resistors, the RC network comprising a first capacitor to vary a first voltage input and a second capacitor to generate a second voltage input;
a first comparator to alternately compare the first voltage input and the second voltage input with the high reference voltage to generate oscillation outputs;
a proportional-to-absolute temperature (PTAT) current digital-to-analog converter (DAC) configured to supply an injection current to a resistor of the series of resistors that variably modulates the high reference voltage and the low reference voltage;
a second comparator to alternately compare the first voltage input and the second voltage input with the low reference voltage and to control generation of an adaptive bias current that is supplied to the first comparator near a switching threshold voltage range of the first comparator;
a chop switch matrix coupled between the high reference voltage, the RC network, and the first comparator, the chop switch matrix to alternately flip voltage reference inputs to a set of input terminals of the first comparator; and
a multiplexer coupled to an output of the first comparator, the multiplexer to alternately invert a polarity of the oscillation outputs in concert with alternately flipping the voltage reference inputs by the chop switch matrix.

11. The wireless device of claim 10, wherein the series of resistors is coupled between a regulator voltage and ground, the resistor is coupled between other resistors of the series of resistors and the ground, and there is at least a second resistor positioned between tap points of the series of resistors for the high reference voltage and the low reference voltage.

12. The wireless device of claim 10, wherein the injection current generated by the PTAT current DAC is based on a temperature coefficient of the resistor and is modulated by a temperature curve trim to compensate frequency of the oscillation outputs according to temperature change of the RTC circuit.

13. The wireless device of claim 10, wherein the RC network further comprises:
a first charge resistor coupled between the first capacitor and a regulator voltage, wherein a first node between the first capacitor and the first charge resistor provides the first voltage input; and
a second charge resistor coupled between the second capacitor and the regulator voltage, wherein a second node between the second capacitor and the second charge resistor provides the second voltage input.

14. The wireless device of claim 10, wherein the RTC circuit further comprises a flip-flop coupled to the output of the multiplexer, the flip-flop to generate a clock that drives timing of alternately flipping the voltage reference inputs to the set of input terminals by the chop switch matrix.

15. The wireless device of claim 14, wherein the voltage reference inputs comprise the high reference voltage and the first voltage input during a first clock cycle and the second voltage input and the high reference voltage during a second clock cycle of the clock that immediately follows the first clock cycle.

16. The wireless device of claim 14, wherein the RC network further comprises:
a first transistor that is drain-source connected across the first capacitor and controlled according to the clock; and
a second transistor that is drain-source connected across the second capacitor and controlled according to an inverted signal of the clock.

17. The wireless device of claim 14, wherein the RTC circuit further comprises a sample multiplexer coupled between the RC network and the chop switch matrix, the sample multiplexer controlled by the clock and to alternately select the first voltage input and the second voltage input according to the clock.

18. The wireless device of claim 10, wherein a voltage difference between the high reference voltage and the low reference voltage is within 20% of 100 millivolts (mV).

19. A method of operating an oscillation circuit comprising a series of resistors comprising tap points that provide a high reference voltage and a low reference voltage that is lower than the high reference voltage, a resistor capacitor (RC) network coupled in parallel with the series of resistors; a first comparator coupled to the RC network; a proportional-to-absolute temperature (PTAT) current digital-to-analog converter (DAC); a second comparator coupled to the series of resistors, the RC network, and the first comparator; a chop switch matrix coupled between the low reference voltage, the RC network, and the first comparator; and a multiplexer coupled to an output of the first comparator, wherein operating the oscillation circuit comprises:

varying a first voltage input with a first capacitor of the RC network;

varying a second voltage input with a second capacitor of the RC network;

alternately comparing, with the first comparator, the first voltage input and the second voltage input with the low reference voltage to generate oscillation outputs;

supplying, with the PTAT current DAC, an injection current to a resistor of the series of resistors that variably modulates the low reference voltage and the high reference voltage;

alternately comparing, with the second comparator, the first voltage input and the second voltage input with the high reference voltage;

controlling, by the second comparator based on the alternately comparing, generation of an adaptive bias current that is supplied to the first comparator near a switching threshold voltage range of the first comparator;

alternately flipping, by the chop switch matrix, voltage reference inputs to a set of input terminals of the first comparator; and alternately inverting, by the multiplexer, a polarity of the oscillation outputs in concert with alternately flipping the voltage reference inputs by the chop switch matrix.

20. The method of claim 19, wherein supplying the injection current generated by the PTAT current DAC is based on a temperature coefficient of the resistor and is modulated by a temperature curve trim to adjust a frequency of the oscillation outputs according to temperature change of the oscillation circuit.

* * * * *